United States Patent [19]

Jenkin

[11] Patent Number: 5,008,160

[45] Date of Patent: Apr. 16, 1991

[54] METHOD OF SECURING ADHERENT COATINGS BY CVD FROM METAL CARBONYLS, AND ARTICLES THUS OBTAINED

[76] Inventor: William C. Jenkin, 382 Dorchester Rd., Akron, Ohio 44320

[21] Appl. No.: 508,356

[22] Filed: Apr. 12, 1990

Related U.S. Application Data

[62] Division of Ser. No. 217,329, Jul. 11, 1988, Pat. No. 4,938,99.

[51] Int. Cl.$^5$ .................. B32B 15/00; B32B 15/20
[52] U.S. Cl. .................. 428/656; 428/675; 428/676; 428/680; 428/686
[58] Field of Search ............ 428/638, 648, 655, 656, 428/660, 661, 664, 671, 672, 673, 675, 676, 680, 686; 427/252, 405

[56] References Cited

U.S. PATENT DOCUMENTS

3,432,278  3/1969  Richards ........................... 428/675

FOREIGN PATENT DOCUMENTS

751523  6/1956  United Kingdom ............... 428/648

OTHER PUBLICATIONS

"The Formation of Metallic Coatings by Vapor-Phase Techniques," C. F. Powell and I. E. Campbell. *Metal Finishing*, vol. 50, No. 4 (Apr. 1952), pp. 64-69.

*Primary Examiner*—R. Dean
*Assistant Examiner*—Robert R. Koehler
*Attorney, Agent, or Firm*—Renner, Kenner, Greive, Bobak, Taylor & Weber

[57] ABSTRACT

Adherent metal coatings of metals that cannot be adherently applied directly onto a desired substrate metal by chemical vapor deposition at a temperature below about 300° C. are obtained by applying an adherent metal undercoating to the surface of the metal substrate which weakly or not at all chemisorbs carbon monoxide, then applying the desired outercoat metal to the undercoated substrate by chemical vapor deposition, using a heat decomposable metal carbonyl as the source of the desired outer coating metal. The undercoating metal may be applied by conventional plating processes such as electroplating or electroless plating. In preferred embodiments, the substrate is iron or steel or their alloys, the undercoating metal is copper, and the outer coating metal is a ferrous metal, i.e., nickel, iron, or cobalt.

12 Claims, No Drawings

METHOD OF SECURING ADHERENT COATINGS BY CVD FROM METAL CARBONYLS, AND ARTICLES THUS OBTAINED

This is a division of application Ser. No. 217,329 filed July 11, 1988, now U.S. Pat. No. 4,938,999.

TECHNICAL FIELD

This invention relates to chemical vapor deposition processes and the resulting products. More especially, this invention relates to processes for producing an adherent metal coating on a metal substrate which cannot be adherently coated directly by chemical vapor deposition (CVD) at a temperature below about 300° C., using a metal carbonyl as the coating agent, and to the composite articles thus obtained.

BACKGROUND ART

Chemical vapor deposition (CVD) is a well known technique for obtaining very pure metal coatings. The chemical vapor deposition process (particularly for depositing nickel) has unparalleled ability to deposit uniform coatings. CVD coatings do not build up on external corners, edges or projections, as do electroplated deposits. And it has outstanding ability to deposit into internal corners and recesses, which electroplated coatings are seriously deficient in accomplishing.

Electroless coatings are uniform; however, electroless nickel is brittle and is not pure (contains 2-8% phosphorus or boron), limiting its usefulness. Copper is the only other metal widely deposited electrolessly, primarily on printed circuit boards.

Vacuum metallized coatings are deposited on a line-of-sight; and flame sprayed coatings are applied on a line-of-sight. Thus uniformity can never compare to CVD. Basically, in CVD, the vapor of a heat decomposable compound of the desired coating metal is allowed to contact the article to be coated (the substrate) under air-excluding (i.e., nonoxidizing) conditions at a temperature sufficiently high to cause the coating metal compound or precursor to decompose. Various types of heat-decomposable compounds are known in the art. Metal carbonyls are particularly desirable as coating agents in CVD processes because of their low decomposition temperatures, which makes possible the use of low operating temperatures that do not damage the substrate and which achieve substantial reduction of technical and engineering problems with attendant economies of operation.

Low operating temperatures particularly make it possible to use equipment having silicone or fluoropolymer rubber seals, both of which are effective and readily available but unable to withstand operating temperatures above 275° C. At operating temperatures of 300° C. or higher, the choice of sealing materials is very limited. No commercial elastomers are available that stand the heat.

Metal carbonyls have two limitations as CVD coating agents: (1) not all metals which are desirable coating metals form carbonyls; and (2) certain metals which are usable as substrates cannot be adherently coated directly by CVD at temperatures below about 300° C. using a metal carbonyl as the vapor coating agent. Notable among such substrate metals are ferrous metals (iron, nickel, cobalt) and their alloys. The reason that these substrate metals cannot be adherently coated by CVD using a metal carbonyl is that the substrate metals chemisorb carbon monoxide, i.e., they tenaciously chemisorb appreciable commodities of carbon monoxide under air-excluding conditions and at all temperatures. Carbon monoxide is inevitably released as a metal carbonyl decomposes on the substrate surface and is adsorbed before the substrate acquires a metal coating. How this inteferes is explained in the following paragraphs. For brevity, metals which absorb appreciable quantities of carbon monoxide under such conditions will be referred to as "metals which significantly chemisorb carbon monoxide", and conversely, metals which adsorb carbon monoxide weakly or not at all under such conditions will be referred to as "metals which do not significantly chemisorb carbon monoxide" or as "metals which have little or no tendency to chemisorb carbon monoxide".

Aluminum and its alloys are not directly coatable adherently by CVD from a carbonyl because they have an oxide layer not reducible at reasonable temperatures. Brass and zinc are not coatable adherently from a carbonyl because the zinc metal has a low vapor pressure, and off-gases. However, these metals when coated adherently with the selected undercoat metals according to this invention can then be coated adherently by CVD from a metal carbonyl.

The term, "chemisorption" and related words including "chemisorb" are used in their art-recognized meaning, as defined for example in "The Condensed Chemical Dictionary", 10th edition, 1981, page 225; revised by G.G. Hawley, published by Van Nostrand Reinhold Co., New York. As explained in "The Condensed Chemical Dictionary", chemisorption results in the formation of bonds comparable in strength to ordinary chemical bonds, between the adsorbent (usually a solid and typically a metal) and the gas or liquid coming into contact with it. The bonds formed in chemisorption are much stronger than the VanderWaals bonds characterized in physical adsorption, or "physisorption", as it will be called herein. While physisorption is reversible, chemisorption is not; the chemisorption material is released only by appreciable expenditure of energy, and then often is released as a material different from that which was chemisorbed.

The mechanism by which an adherent bond is formed between the coating metal and a substrate metal which chemisorbs carbon monoxide is believed to be as follows: at the surface where decomposition of the metal carbonyl takes place, initially, the metal carbonyl molecule splits apart and the carbon monoxide so formed becomes adsorbed on the substrate metal surface before the coating metal atom can be attached to the crystal lattice of the substrate. Then, when the metal atoms approach the crystal lattice, the adsorbed carbon monoxide is released and a gas-filled gap is created between the substrate and the deposited atoms. Once CVD has started and is proceeding smoothly, the mechanism of deposition alters, the metal carbonyl molecule is first adsorbed on the substrate coating and then decomposes with the carbon monoxide escaping and the metal atom fitting into the crystal lattice of the now growing coating. Even so, there is competition between adsorption of carbon monoxide and the metal carbonyl. Furthermore, the gas filled gap at the interface between the substrate and the coating remains. As a consequence, the bond between the substrate and the coating is only a mechanical bond and not a metallurgical bond. A metallurgical bond can be distinguished from a mechanical bond by a simple bending test when both the substrate and the coating metal are ductile. A coated strip of substrate metal is bent around a radius equal to its thickness; the coating will not separate if there is a metallurgical bond between the substrate and the coating metal. If the bond is simply a mechanical bond, the coating will separate when this bending test is carried out. It is believed that there is some attractive force between atoms of the substrate metal and atoms of the coating metal at the interface in a metallurgical bond; a mechanical bond, on the other hand is achieved simply by interlocking of the coating metal with surface asperities of the substrate.

However, when deposition is on a metal that weakly or not at all chemisorbs carbon monoxide (copper, tin, silver, gold), very little or no carbon monoxide is chemisorbed, and some may be physisorbed; the physisorbed (and weakly chemisorbed) carbon monoxide is released simultaneously as the atoms of metal are deposited, and escapes while the atoms are individually depositing and agglomerating into small islands, then growing together into a complete coating. Deposition is started at a low rate, in a dilute mixture of metal carbonyl in a carrier gas, to permit this phenomenon of the escaping of the carbon monoxide to occur. When the gas has escaped, there is no gap between substrate and coating and a metallurgical bond is achieved.

U.S. Pat. No. 3,086,881 to Jenkin (the inventor herein) describes one method for obtaining an adherent metal coating on a carbon steel or alloy steel substrate. According to the method disclosed in this reference, the iron or steel substrate surface is first deoxidized with hydrogen at a temperature of at least about 700° F. (about 370° C.). An ammonia-carbon monoxide mixture is then flowed into the reactor to displace the hydrogen. Then nickel carbonyl is introduced into the reactor while flow of the ammonia-carbon monoxide mixture continues, resulting in adherent deposition of nickel on the ferrous metal substrate. A disadvantage of this process is that a minimum temperature of about 700° F. is required. Higher minimum temperatures are required when the steel substrate is alloyed with chromium. For example, a minimum temperature of about 900° F. is required for a 1% chrome steel, and a minimum of about 1800° F. is required for a high chrome steel. A further disadvantage is that very high purity gases ($H_2, CO, NH_3$) are required.

U.S. Pat. No. 3,537,881 to Corwin describes a method for gas plating a substrate which cannot be adherently plated directly. Specifically, a copper surface, which according to patentee cannot be adherently plated with nickel deposited from nickel carbonyl, is first treated with a wetting agent such as mercury (other examples include tin and gold), then the treated substrate surface is vapor coated at 150° C. with nickel deposited from nickel carbonyl vapor. An adherent coating is obtained. Other systems disclosed include zinc substrates wet with copper and then vapor coated with chromium from chromium carbonyl vapor.

Other references disclosing processes in which an intermediate metal layer (or undercoat layer) is applied to a substrate before a metal outer (or outercoat) layer is applied by CVD, include the following: U.S. Pat. No. 2,956,909 to Robinson (plastic or paper substrate; silver intermediate layer and nickel outer layer, i.e., plastic or paper/silver/nickel); U.S. Pat. No. 3,175,924 to Norman et. al. (Vanadium coated on various substrates including nickel plated steel); and U.S. Pat. No. 3,253,946 (Mangenese, chromium, molybdenum or tungsten deposited on various substrates including nickel-plated steel).

U.S. Pat. No. 3,294,654 to Norman et. al. discloses a process which is basically the reverse of the present process; i.e., a substrate which cannot be electroplated is first coated with an intermediate layer by chemical vapor deposition, then a final metal coating is electrodeposited. The non-electroplatable substrate may be highly pure molybdenum or tungsten, or a non-metalic material; the intermediate layer may be a transition metal (Group IVB, VB, or VIB) or aluminum; and the electroplated layer may be copper.

Of various methods of obtaining adherent metal coatings by CVD when the coating metal cannot be adherently deposited directly onto the desired substrate metal in this manner, all presently known processes have some disadvantage. In particular, adherent deposition by CVD from a metal carbonyl onto a ferrous metal substrate has not been previously achieved except by working at high temperatures as for example, in U.S. Pat. No. 3,086,881. High operating temperatures lead to very difficult problems of gas seals and add to the expense of the process; furthermore, it is more difficult to maintain uniform temperature at high operating temperatures than at lower operating temperatures.

DISCLOSURE OF THE INVENTION

Applicant has found that adherent metal coatings on a metal substrate surface can be obtained by chemical vapor deposition using a metal carbonyl as the heat decomposable compound, even when adherent coatings cannot be obtained in this manner by coating the substrate metal directly at a temperature below about 300° C.

According to one aspect of this invention, a substrate having an adherent coating of a metal which will not adhere firmly to the substrate when deposited directly thereon from a metal carbonyl is obtained by a process comprising:

(a) forming on the surface of the substrate a thin layer of an undercoat metal which adheres to the substrate metal and which has little or no tendency to chemisorb carbon monoxide; preferred thickness, 0.5 to 1 micron;

(b) heating the undercoated substrate to at least about 200° C. in a reducing atmosphere, thereby reducing any metal oxide impurities present on the surface of the undercoat layer; and (c) contacting a dilute gaseous mixture of a heat decomposable metal carbonyl with the undercoated substrate under reducing conditions at a temperature of at least about 200° C., thereby slowly depositing a thin metal outercoat layer on the undercoat layer, then increasing the concentration of the carbonyl and most commonly reducing the temperature and applying a heavy coating, commonly 0.002 to 0.005 inch (50–120 coat microns), the outercoat metal being a metal which chemisorbs carbon monoxide and which does not readily adhere to the substrate metal when deposited thereon from said metal carbonyl.

This invention according to another aspect provides a composite article comprising:

(a) a substrate having a surface of irregular contour comprising a metal which significantly chemisorbs carbon monoxide and which forms at least the surface of the substrate;

(b) a thin undercoating layer of a metal which adheres to the substrate metal and which has little or no tendency to chemisorb carbon monoxide;

(c) an outcoat layer of a metal which adheres to the undercoat metal but does not readily adhere to the substrate metal when deposited directly thereon from a metal carbonyl; and (d) said outercoat layer being deposited on said undercoat layer from a carbonyl of the outercoat metal, said undercoat layer being essentially free of metal oxide impurities at the time said outercoat layer is deposited thereon.

BEST MODE FOR CARRYING OUT THE INVENTION

This invention will be described with particular reference to the formation of a composite article comprising an iron or steel substrate, a thin copper undercoat layer, and a nickel outercoat layer. In particular, the substrate may be carbon steel or a low alloy steel, which has good mechanical properties such as high tensile strength, high Young's modulus and high ductility, but which tends to rust or corrode. This composite article has the good mechanical properties of the steel substrate and the good rust and corrosion resistance of the nickel outer layer, and is used for a number of purposes for which both good mechanical properties and good corrosion resistance are required.

Other metals and alloys which chemisorb carbon monoxide at elevated temperatures can also be used as substrates in the present invention. These include, for example, other ferrous metals (i.e., cobalt and nickel) and their alloys, aluminum, and copper-zinc alloys such as brass. While copper, the major constituent of the latter alloys, does not chemisorb carbon monoxide (or, at least, does so only to a limited extent), zinc has a vapor pressure of 0.1 micron at 450° F. and so copper-zinc alloys containing as little as about 2% by weight of zinc are not suitable materials for direct deposition of a coating metal from its carbonyl by chemical vapor deposition. Cadmium is also a non-absorber of carbon monoxide but has an even higher vapor pressure.

While the substrate material is usually a metal or alloy of uniform composition throughout, it may comprise a surface of a metal or alloy which significantly chemisorbs carbon monoxide, on a base which may be another metal or alloy, or even a nonmetallic material. For instance, the substrate may be aluminum with a thin layer of zinc formed thereon. A metalized plastic wherein the metal readily chemisorbs carbon monoxide, or a semiconductor material having a surface layer of a metal which significantly chemisorbs carbon monoxide, may also constitute the substrate.

Adherently coated articles are obtained according to the present invention by first applying an undercoating metal to the surface of the substrate before coating with the desired outercoat metal via CVD. The undercoating metal may be any metal which adheres to the substrate metal and which does not significantly chemisorb carbon monoxide. By far the most important undercoat metal for the purposes of this invention is copper. However, other metals which do not chemisorb carbon monoxide, such as silver, gold and tin, may be used as undercoating metals. Zinc and cadmium are non-chemisorbers of carbon monoxide but have a significant vapor pressure at 230° C. and so are not usable due to off-gassing.

The undercoating metal may be applied by conventional coating techniques, such as electroplating and electroless coating. The undercoating metal layer is preferably very thin, e.g., from monomolecular thickness up to about one micron (this upper limit is not critical). A preferred undercoat thickness is from about 10 to about 50 millionths of an inch (i.e., about 0.25 to about 1.25 micron).

The outercoat metal may be any metal which forms a metal carbonyl and which confers desired surface properties to the coated substrate. Nickel is a particularly preferred outercoat metal, particularly when the substrate is iron or steel. Nickel has high oxidation and corrosion resistance, as is well known. Nickel also forms a carbonyl, $Ni(CO)_4$, which boils at 43° C. and which is heat decomposable to form nickel and carbon monoxide. In general, the transition metals of Groups IVB through VIII (but not those of Group IB) of the periodic table form decomposable metal carbonyls and may be used as outercoat metals according to this invention. Carbonyl-forming metals which may be used as outercoat metals herein include, for example, vanadium, molybdenum, manganese, iron, cobalt, rhenium, osmium.

The preferred process of this invention is as follows:

First, it is usually necessary to prepare the surface of the substrate to receive an adherent coating of the undercoat metal. Conventional preparation methods may be used. For example, the substrate surface may be cleaned with a detergent, rinsed, then activated, usually with an acid. Activating may be accomplished either with or without use of an electrical current; for example, substrate surface may be activated with a 1:1 hydrochloric acid solution (i.e., a solution prepared by diluting commercial concentrated hydrochloric acid with an equal volume of water), which contains approximately 20% by weight HCl, or may be electro etched with a sulfuric acid-phosphoric acid mixture according to known techniques. The activated or etched surface is then thoroughly rinsed with water. The undercoat metal is immediately applied.

Aluminum substrates are given a zincate treatment with an aqueous alkali metal zincate/alkali metal hydroxide solution before undercoating to assure adherence of the undercoat metal (usually copper). Commercial formulations are available for this purpose. The zincate-treated substrate is water rinsed and immediately copper plated.

The undercoat metal may be applied by conventional techniques. For example, copper may be applied by either electroplating, electroless coating, or immersion copper coating all of which are well-known. Other desired undercoating metals may also be applied by conventional techniques. The undercoating must be exceptionally thoroughly water rinsed to remove all soluble salts. A final rinse in distilled water is preferred, followed by blow-drying.

It is essential that the undercoat metal surface be free of metal oxide impurities before chemical vapor deposition is commenced. Copper and other metal deposits obtained by conventional electroplating or electroless coating can immediately develop a surface layer of metal oxide by air oxidation. This is highly detrimental to adhesion of the outercoat layer. These metal oxides may be removed by heating the undercoated article (substrate with the undercoated layer thereon) to a temperature of at least 200° C. in a reducing atmosphere, preferably one which contains hydrogen. This will reduce any surface metal oxides present. The undercoated article (or substrate) is placed in a gas tight reactor capable of withstanding temperatures up to at least 300° C. and equipped with gas inlets and outlets and means (e.g., an electrically heated platen) for supporting and heating the substrate. The same reactor is preferably used both for metal oxide reduction and for CVD which follows. The reactor is purged, first with an inert gas, preferably argon, then with a reducing gas, preferably hydrogen. The substrate is then heated to the desired metal oxide reduction temperature, i.e., from about 200° to about 300° C., while a stream of reducing gas, e.g., hydrogen, which may be diluted with an inert gas, e.g., argon, is flowed through the reactor. Flow is continued long enough to reduce any metal oxides in the undercoat layer to the metallic state.

The article is then ready for application of the outercoat layer by CVD. First, the reactor is purged with carrier gas, which is reducing in nature, while a temperature of about 200-300° C. is maintained. Then a plating gas stream containing a low concentration of a carbonyl of the desired outercoat metal in the carrier gas is contacted with the article (or undercoated substrate), while the article is at a temperature above the decomposition temperature of the metal carbonyl. The carbonyl concentration is preferably increased and the substrate temperature reduced as metal deposition continues. This will be described in greater detail below. Flow of metal carbonyl is stopped when sufficient coating is applied while coating gases are purged with an inert gas. The cooled article is removed from the reactor.

The carrier gas is reducing in nature, and to that end contains either carbon monoxide, hydrogen or both, and optionally one or more inert diluent gases such as carbon dioxide, nitrogen or argon. Carbon monoxide is a highly desirable carrier gas for deposition of nickel by CVD. Carbon monoxide can also be used as the carrier gas for deposition of other metals which form ductile deposits when deposited from the corresponding metal carbonyl in a carbon monoxide carrier gas stream. On the other hand, conjoint use of carbon monoxide as the carrier gas and a metal carbonyl as the plating agent results in brittle deposits of certain metals such as iron and molybdenum. Applicant has found that ductile deposits of these metals can be obtained by using as the carrier gas a mixture consisting essentially of hydrogen and carbon dioxide in amounts of about 40 to about 60% by volume, preferably about 45 to 55% by volume each, of hydrogen and carbon dioxide. Particularly preferred carrier gas compositions are those consisting essentially of substantially equal volumes of hydrogen and carbon dioxide (i.e., about 49-51% by volume each of hydrogen and carbon dioxide). Additional inert gases, such as nitrogen, argon and water vapor, may be present in the hydrogen/carbon dioxide mixture in minor amounts insufficient to affect the ductility of the outercoat metal deposit. (When inert gases are present, the aforesaid amount of hydrogen and carbon dioxide are on the basis of the combined volume of $H_2$ and $CO_2$.)

After the reactor has been purged with carrier gas, following the hydrogen reduction, deposition of the desired outercoating metal from its metal carbonyl commences. Metal carbonyl is contained in a stream of carrier gas as aforedescribed. Best results are achieved if the concentration of metal carbonyl is progressively increased and the substrate temperature is progressively decreased as metal deposition continues. This may be done either stepwise or continuously. Initial metal carbonyl concentration is typically from about 0.5% to about 2% by volume, based on the total quantity of plating gas (which is metal carbonyl plus carrier gas). The initial plating temperature is over 200° C., preferably from about 200° to about 300° C. Optimum plating temperatures may vary slightly from metal to metal, but in no case is it necessary or even desirable to use a plating temperature over 300° C. (Plating temperatures refer to the temperature at the surface of the substrate.) The initial substrate temperature and metal carbonyl concentration are maintained until the surface of the undercoat layer is covered with outercoat metal. The metal carbonyl concentration may then be increased slightly, e.g., to about 1 to 2% by volume, while maintaining the substrate temperature above 200° C. and preferably at the initial level. The metal carbonyl concentration may be increased progressively and the substrate temperature lowered progressively until the final metal carbonyl concentration, about 10 to about 50% by volume of total plating gas, and the final substrate temperature, which is from about 150° to about 250° C., the preferred temperature depending on the metal carbonyl, are reached. Plating is continued at the final concentration and temperature until the desired outercoat metal thickness is reached. This final thickness may be from about 1 to about 10 mils (0.001-0.010 inch, or about 0.025-0.25 mm), preferably from about 2 to about 5 mils (0.002-0.005 inch or about 0.05-0.12 mm).

After the desired outercoat metal thickness has been reached, heat is removed from the substrate, flow of the metal carbonyl is stopped, then the carrier gas stream is stopped, and the reactor is purged and the substrate cooled down to ambient temperature. The reactor may be purged first with a reducing gas, e.g., carrier gas for approximately five minutes (this time is not critical), then with an inert gas (e.g., argon, nitrogen or carbon dioxide) until all reducing gas has been purged and the substrate has cooled to ambient temperature (or at least sufficiently so that the outercoat metal will not be oxidized in air when removed from the reactor). Heating of the substrate is usually discontinued when the flow of metal carbonyl vapor has been stopped.

Most outer coatings are ductile as formed. However, in some cases it is necessary or at least desirable to anneal the fully coated workpiece, in order to achieve a ductile coating. For example, iron when deposited from iron carbonyl is typically brittle, even when the preferred carrier gas containing approximately equal volumes of hydrogen and carbon dioxide is used. Annealing may be carried out under conventional conditions, e.g., in a commercial protective atmosphere (typically mixtures of hydrogen, carbon monoxide and inert gases.)

Coated articles prepared according to the present invention are composite articles which have the physical and machanical properties of the substrate and the surface properties of the outercoat layer. For example, composite articles in which the substrate is carbon steel and the outercoat metal is nickel have the oxidation and corrosion resistance of nickel and the mechanical properties (e.g., tensile strength, yield strength, compressive strength, etc.) and thermal properties of carbon steel. Steel articles which may be nickel coated according to this invention include a wide range of articles such as pumps, compressors, internal combustion engines (especially engine cylinders and pump or compressor working surfaces which are exposed to high temperature reactant gasses or combustion products); pressure vessels (especially those used for handling corrosive fluids), shipping containers, chemical reactors, and other types of apparatus where both corrosion resistance and good mechanical properties are necessary. Steel substrates according to this invention are particularly useful for interior surfaces of containers and vessels (ranging from internal combustion engine cylinders to reaction vessel interior linings) which are exposed to corrosive fluids, often at high temperatures.

Preferred coated articles of this invention are those in which the substrate has a surface of irregular contour. Particularly preferred coated articles of this invention are enclosed vessels (especially cylindrical steel vessels) in which the interior wall surface is of irregular contour due to the presence of edges or corners, e.g., the edges at the intersections of the side wall with the end walls of a cylindrical vessel.

A particular advantage of coated articles according to the present invention is that the CVD-deposited outercoat is highly conformal, that is, its thickness varies but little (i.e., no more than ±30% from mean thickness), even at the edges and corners of a substrate having a surface of irregular contour. Thus, even at the intersection of the sidewall and an endwall of a cylinder (e.g., a pump or engine cylinder, the interior of a reaction vessel, or the like) which typically intersect at right angles, there is neither excess coating metal deposit nor uncoated substrate, and the outercoat metal is adherently bonded to the substrate. Furthermore, a CVD coating of this invention is continuous, i.e., it covers the entire surface to which it is applied without voids or pinholes. This prevents a corrosive or otherwise harmful fluid in a container or vessel from contacting the substrate. Coatings deposited by the CVD offer a distinct advantage in this respect over metal coatings deposited by other methods, such as electroplating or vapor deposition from metal vapor under vacuum (including sputtering). In addition, CVD-deposited outercoatings according to the present invention are, in most cases (including nickel-coated steel articles), highly pure, being essentially devoid of metals other than the coating metal and essentially devoid of nonmetallic impurities other than carbon, and typically containing no more than about 1% by weight of carbon. (In contrast, brittle iron and molybdenum outer coatings, formed from the metal carbonyl in the presence of carbon monoxide as the carrier gas, contain more than 1% by weight of carbon and may contain up to about 8% by weight of carbon.) In some cases these outercoatings are ductile, (e.g., nickel and cobalt), and in some cases are brittle (e.g., iron and molybdenium), but the latter can be be annealed. Most are adherent to the undercoat metal via metallurgical bond rather than a mechanical bond. In a few cases of coatings deposited in accordance with the present invention, such as the case of nickel deposited by CVD on aluminum previously undercoated with copper, the bond is not fully metallurgical, but is better than mechanical, because of the difficulties in metallurgically bonding the undercoating metal to aluminum, even when the surface has been zincate treated. Even so, aluminum/copper/nickel coated articles have various uses, particularly those where high bending stresses will not be encountered.

This invention will now be described in further detail with reference to the specific embodiments which follow.

EXAMPLES

The following general procedures were used, with variations as noted in the examples below, to prepare and test metal-coated test specimens in accordance with this invention. Thin rectangular matal strips (uncoated) are used as the test specimens.

The reactor used for reducing all surface metal oxides in the undercoat layer and for applying metal outercoatings via CVD was a gas tight reactor having a reaction chamber, a pair of hooks for supporting the substrate, infra red heat lamps outside the reactor for heating the substrate, a "Teflon" window between the infra red lamp and the substrate, flowing (external) air to cool the "Teflon" (trademark for polytetrafluoroethylene plastic of duPont) and gas inlets and outlets for admitting and exhausting plating gas (metal carbonyl plus carrier gas) and purge gas.

The general procedure for coating specimens was as follows:

1. Prepare the surface of the uncoated specimen. (Details will be given in the specific examples.)
2. Coat this specimen with copper to a thickness in the range of $10 \times 10^{-6}$ to $50 \times 10^{-6}$ inch by conventional means, i.e., electroplating or immersion copper coating.
3. Place the copper-coated substrate on the platen and close the chamber.
4. Purge the chamber with argon, then with a gas mixture of 25% hydrogen 75% argon by volume.
5. Heat the specimen to about 225°-275° C. (about 435°-525° F.) while passing the reducing gas mixture of 25% hydrogen and 75% argon by volume through the reactor.
6. Cut off hydrogen/argon mixture and pass a carrier gas stream through the chamber while maintaining a substrate temperature at the same temperature as that used in Step 5.
7. Cut off the carrier gas, and commence introduction of a plating gas stream containing about 0.5%-1% by volume of metal carbonyl, remainder carrier gas (having the same composition as in step 6) into the reaction chamber, continuously pass this plating gas through the reaction chamber, deposit metal by decomposition of the metal carbonyl on the copper-coated substrate until the substrate surface is covered, and continuously withdraw the carrier gas stream of reduced metal carbonyl content. The initial substrate temperature is the same as the temperature in Steps 5 and 6.
8. When the substrate is covered with a thin layer of outercoat metal, increase the metal carbonyl content of the gas stream to 1-2% by volume while maintaining gas stream flow and platen temperature as in step 7.
9. Cool platen temperature to 400° F. (204° C.), and increase metal carbonyl content of gas stream to 4% by volume; continue gas stream flow for one minutes.
10. Cool platen temperature to 345° F. (about 175° C.) and increase metal carbonyl content of gas stream to 10-50% by volume; continue gas stream flow until desired coating thickness is achieved (about 10-20 minutes).
12. When desired coating thickness has been achieved, discontinue the metal carbonyl, discontinue heat, and purge with carbon monoxide or carrier gas stream. After five minutes, discontinue carbon monoxide flow and purge with an inert gas (argon, nitrogen or carbon dioxide).

Actual conditions (which include some variations from the general procedure) are shown in the examples which follow.

Coated test strips are tested for adhesion of coating by the bend test as follows: each coated test specimen is bent around a radius equal to the thickness of the test specimen. The metal coatings will not separate if they are adherent. The bend test is used except where otherwise noted. A few specimens are tested by the saw test (a less stringent test), in which a saw blade is drawn over one spot of an edge of the test specimen. The coating is adherent if no cracking or delamination occurs. Results obtained with individual test specimens are given in the examples below.

EXAMPLE 1

Nickel on cold rolled steel

Four carbon steel strips (AISI-SAE 1010), designated as A, B, C and D, were detergent cleaned, then etched at room temperature in a 20% hydrochloric acid, then thoroughly rinsed with water, then copper coated from a commercial copper strike plating bath, rinsed in water, then methanol, dried and placed in the reaction chamber. Those test specimens having rough surfaces were electroetched before the hydrochloric acid etch. The test specimens were then nickel coated by CVD. The general preparation method was followed, with variations as noted in Table I; carbon monoxide was used in Steps 6 and 7.

All test specimens passed the bend test.

EXAMPLE 2

Nickel on Stainless Steel

Three stainless steel test strips designated A, B and C, were the test specimens in this example. The stainless steel grade in each specimen is shown in Table II.

The surface of each test specimen was electroetched in a commercial phosphoric acid-sulfuric acid electro etched bath, then depassivated cathodically in a 20% hydrochloric acid bath for 4 minutes at 0.15 amperes per square inch.

The specimens were copper coated by electroplating at a current density of 0.1 ampere per square inch, using a common commercial copper strike bath, then water rinsed, methanol rinsed, dried and placed in the reaction chamber.

The test specimens were nickel coated by CVD according to the general preparation method; specific conditions are shown in Table II. Nickel coating thicknesses range from 0.002 to 0.003 inch.

Test specimens coated in accordance with this example pass the bend test or the saw test.

EXAMPLE 3

Molybdenum on Cold Rolled Steel

The test specimens in this example are carbon steel, AISI-SAE1010 strips.

The test specimens are surface treated and copper coated as in Example 1. The copper-coated specimens are heated to 250° C. in a hydrogen/helium (25%/75% by volume) atmosphere to reduce surface metal oxides. The carrier gas in this example was a mixture of equal volumes of hydrogen and carbon dioxide. Molybdenum is deposited by CVD over a 9-minute period starting with a plating gas which initially contains 49.5% hydrogen, 49.5% carbon dioxide and 1% moybdenum hexacarbonyl, all by volume. The $Mo(CO)_6$ concentration is increased over this nine minute period until the average concentration is 11% by volume and then additional time is allowed. A substrate temperature of 450° F. (232° C.) is maintained throughout the experiment. A molybdenum coating approximately 0.0015 inch thick is obtained. Coating is brittle on the bend test but is adherent.

EXAMPLE 4

Iron on Brass (10% Zinc)

The test specimens are brass strips, containing 10% zinc, balance copper by weight.

The test specimens are etched in a commercial copper etch, water rinsed, dipped in 20% HCl, water rinsed, then copper electroplated, thoroughly rinsed, dried and placed in the reaction chamber. The specimens are heated to 235° C. in an atmosphere of 25% hydrogen, 75% argon by volume. A plating gas mixture initially containing 49% hydrogen, 50% carbon dioxide and 1% iron pentacarbonyl by volume is used. After the specimen is covered, the substrate temperature is reduced and the iron pentacarbonyl concentration increased stepwise to a final temperature of 210° C. After reaching 210° C., the average carbonyl concentration is maintained at about 20% by volume.

The coated test specimens are divided into two groups, the first group of specimens are annealed in a hydrogen containing atmosphere at 820° C. for 60 minutes before bend testing. The second group are tested "as is" in the bend test. The annealed specimens were ductile and adherent, while those tested "as is" were found to be brittle

EXAMPLE 5

Nickel on Aluminum

The test specimens are strips of aluminum $\frac{1}{8}" \times 1 \times 4"$.

The test specimens were cleaned in a commercial etch-detergent bath and given a conventional commercial zincate treatment with zinc oxide dissolved in strong aqueous caustic soda to deposit a thin surface layer of zinc. (This is necessary in order to obtain adherence of the electroplated copper layer). The zinc-coated test specimens are thoroughly rinsed with water and immediately copper electroplated from a copper pyrophosphate bath, rinsed, blow dried and placed in the reaction chamber. The specimens are nickel coated by CVD as in Example 1. A coating thickness of about 0.0015 inch is obtained.

Some separation of the nickel and copper coatings from the substrate at the copper-aluminum interface is observed in the bend test. This indicates that a limited bond is obtained, rather than a metallurgical bond. Bond is adequate for most commercial applications.

While this invention has been described with reference to preferred embodiments thereof, it is understood that the invention shall not be limited thereto.

TABLE I

|  | SPECIMEN | | | |
|---|---|---|---|---|
|  | A | B | C | D |
| Thickness, inch | ⅛ | ⅛ | 1/16 | ⅛ |
| Etch | Electroetch 2 min. | HCl dip 30 min. | HCl dip 30 min. | Electroetch 2 min. |
| Undercoat | Copper Electroplate | Copper Electroplate | Copper Immersion | Copper Electroplate |

TABLE I-continued

| | SPECIMEN | | | |
|---|---|---|---|---|
| | A | B | C | D |
| | | | Plate | |
| Hydrogen-argon reduction temp. °C. | 265° | 238° | 238° | 274° |
| CVD: Carbonyl concentration and temp., °C. | 0.5%, 1% at 265°; 2% at 232°; 4% at 250°; 50% at 177° | 1%, 2% at 238°; 4% at 204°; 50% at 171° | 1%, 2% at 238°; 4% at 204°; 50% at 171° | 0.5%, 1% at 274°; 2% at 232°; 4% at 204°; 50% at 179° |
| CVD time, min. | 10 | 13 | 13 | 25 |
| Outercoat thickness, inch | 0.0014–0.002 | 0.0016 | 0.0016 | 0.005 |
| Bend test | Passed | Passed | Passed | Passed |

TABLE II

| | SPECIMEN | | |
|---|---|---|---|
| | A | B | C |
| Material | 17-4PH Stainless | AISI 403 Stainless | AISI 403 Stainless |
| Size, inch | 2 × 6 × ⅛ | 2 × 6 × ⅛ | 2 × 2 × ⅛ |
| Etch | Electroetch | Electroetch | Electroetch |
| Undercoat | Copper | Copper | Copper |
| Hydrogen-argon reduction temp., °C. | 274° | 274° | 238° |
| CVD: carbonyl concentration and temp., °C. | 0.5%, 1% at 274°; 2% at 232°; 4% at 204°; 50% at 185° | 0.5%, 1% at 274°; 2% at 232°; 4% at 204°; 50% at 185° | 0.5%, 1% at 238°; 2% at 205°; 50% at 174° |
| CVD Time, min. | 27 | 27 | 12 |
| Outercoat Thickness, inch | 0.003 | 0.003 | 0.001 |
| Ductility, Bend test | — | — | Passed |
| Saw test | Passed | Passed | — |

What is claimed is:

1. A composite article comprising:
   (a) a substrate having a surface and comprising a metal which readily chemisorbs carbon monoxide, said metal forming at least the surface of said substrate;
   (b) a thin undercoating layer of a metal which adheres to the substrate metal and which has little or no tendency to chemisorb carbon monoxide; and
   (c) an outercoat layer of substantially uniform thickness, said outercoat being of a metal which adheres to the undercoat metal but does not readily adhere to the substrate metal when deposited directly thereon from a metal carbonyl;
   (d) said outercoat layer having been deposited on said undercoat layer at from about 225° C. to about 275° C. from vaporized carbonyl of the outercoat metal; said undercoat layer being essentially free of metal oxide surface impurities.

2. A composite article according to claim 1 in which the substrate is a metal or alloy of essentially uniform composition.

3. A composite article according to claim 2 in which the substrate is a ferrous metal or alloy.

4. A composite article according to claim 3 in which the substrate is iron or steel.

5. A composite article according to claim 4 in which the substrate is carbon steel or a low alloy steel.

6. A composite article according to claim 2 in which the substrate is aluminum or an alloy thereof.

7. A composite article according to claim 6 in which the surface of said substrate is zincate treated prior to coating of said undercoat metal thereon.

8. A composite article according to claim 2 in which the substrate is a copper-zinc alloy.

9. A composite article comprising:
   (a) an iron or steel substrate having an irregular contour;
   (b) a thin undercoat layer of copper, having a thickness of from about $10 \times 10^{-6}$ inch, deposited on a surface of said substrate; and
   (c) a ductile outercoat layer of nickel deposited on said undercoat layer, said outercoat layer having been deposited from a vaporized carbonyl on an essentially oxide-free surface of said undercoat layer at from about 225° C. to about 275° C. said outercoat layer being from about 0.001 to about 0.010 inch thick and having a thickness variation not over about ±30% of mean thickness, said outercoat layer containing no more than about 0.05% by weight of carbon and being essentially free of metals other than nickel and nonmetals other than carbon or boron.

10. A composite article according to claim 1, wherein said surface of said substrate has irregular contours.

11. A composite article according to claim 9, wherein said substrate has an irregular contour.

12. A composite article according to claim 9, wherein said substrate is a lowalloy steel.

* * * * *